(12) United States Patent
Pernull et al.

(10) Patent No.: US 10,601,439 B2
(45) Date of Patent: Mar. 24, 2020

(54) SIGMA-DELTA CONVERTERS AND CORRESPONDING METHODS

(71) Applicant: Infineon Technologies AG, Neubiberg (DE)

(72) Inventors: Martin Pernull, Villach (AT); Massimo Rigo, Villach (AT); Herwig Wappis, Drobollach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/287,558

(22) Filed: Feb. 27, 2019

(65) Prior Publication Data

US 2019/0268014 A1 Aug. 29, 2019

(30) Foreign Application Priority Data

Feb. 28, 2018 (DE) .................. 10 2018 104 530

(51) Int. Cl.
 *H03M 3/00* (2006.01)
 *H03M 1/38* (2006.01)
 *H03M 1/12* (2006.01)
(52) U.S. Cl.
 CPC ........... *H03M 3/494* (2013.01); *H03M 1/128* (2013.01); *H03M 1/38* (2013.01); *H03M 3/368* (2013.01)

(58) Field of Classification Search
 CPC ........ H03M 3/494; H03M 3/368; H03M 1/38; H03M 1/128
 USPC .......................................... 341/143
 See application file for complete search history.

(56) References Cited

U.S. PATENT DOCUMENTS

| 6,201,835 | B1 * | 3/2001 | Wang ...................... H03M 3/34 341/143 |
| 6,753,799 | B2 * | 6/2004 | Colonna ............... H03M 3/338 341/143 |
| 6,975,255 | B1 * | 12/2005 | Zhang ................... H03M 3/332 341/131 |
| 7,084,799 | B1 * | 8/2006 | Butler ................... H03F 3/2175 341/143 |
| 2006/0227019 | A1 | 10/2006 | Somayajula |
| 2016/0305838 | A1 | 10/2016 | Wiesbauer et al. |

FOREIGN PATENT DOCUMENTS

DE 102016117464 A1 3/2018

* cited by examiner

*Primary Examiner* — Brian K Young
(74) *Attorney, Agent, or Firm* — Slater Matsil, LLP

(57) ABSTRACT

Sigma-delta converters having a sampling circuit are provided. The sampling circuit is actuated such that sampling times are at least partially random.

19 Claims, 15 Drawing Sheets

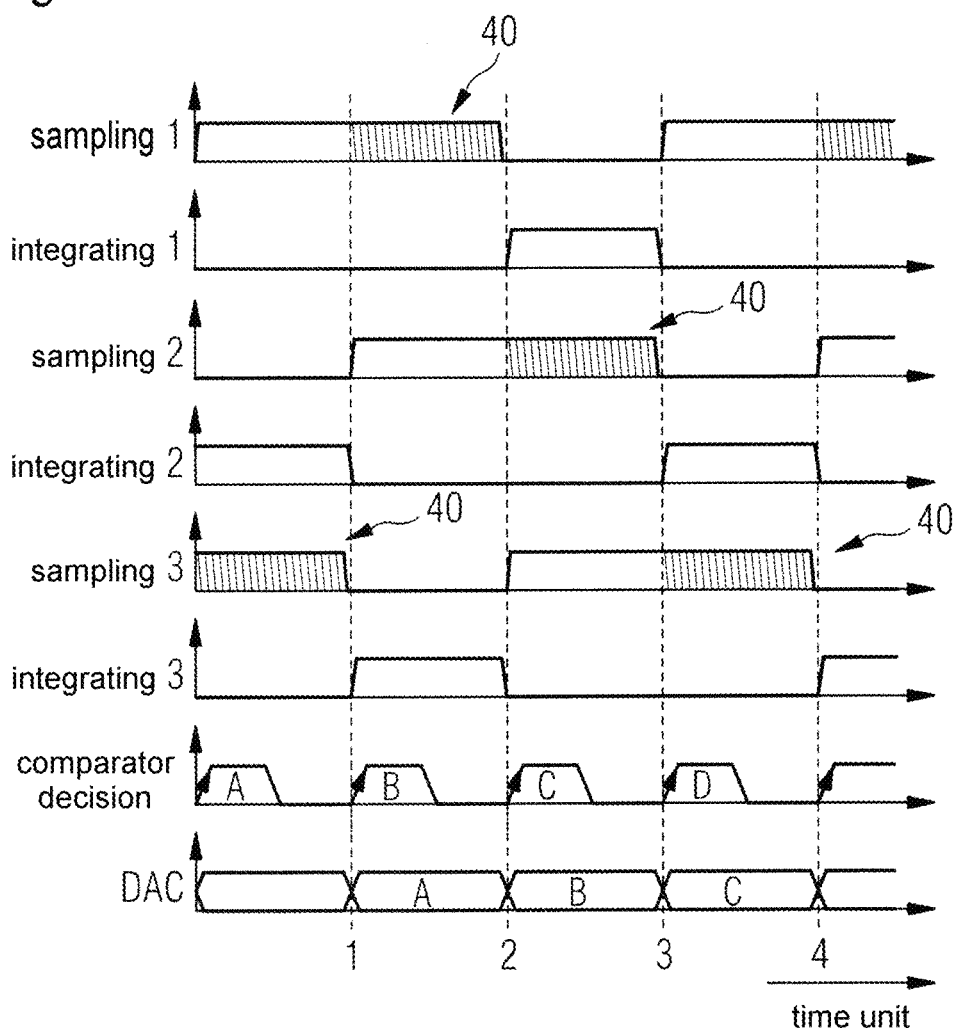

SIGMA-DELTA CONVERTERS AND CORRESPONDING METHODS

This application claims the benefit of German Application No. 102018104530.1, filed on Feb. 28, 2018, which application is hereby incorporated herein by reference in its entirety.

TECHNICAL FIELD

The present application relates to sigma-delta converters and to corresponding methods.

BACKGROUND

Sigma-delta modulators can be used in order to implement analog-to-digital converters (ADCs). Sigma-delta modulators can also be used in order to convert a digital signal from one signal format (e.g. an n-bit signal) into another signal format, in particular a 1-bit stream. Such converters, in particular analog-to-digital converters, using a sigma-delta modulator, subsequently also referred to as a sigma-delta converter, can use oversampling with noise shaping to attain high quantization resolutions. In such sigma-delta converters, a digital filter limits a spectrum of a generated output bitstream to an intended bandwidth.

Discrete-time sigma-delta modulators sampling an input signal at a certain sampling frequency would require a bandlimited input signal to be supplied in order to avoid violating the sampling theorem. Otherwise, what is known as aliasing can arise, in which interference signals at higher frequencies in the input signal are "aliased" into a designed bandwidth of the output signal, i.e. the interference signals then arise within the desired bandwidth of the output signal. In many practical applications, the input signal is not sufficiently bandlimited, however, and also cannot be bandlimited in this way in a simple manner. This can then just lead to the aforementioned aliasing, which can interfere with a measurement, e.g. in measurement applications, and can also lead to interference in other applications.

A conventional solution to this problem is to use an active antialiasing filter that limits the input bandwidth. Another conventional approach is to provide a sampling clock signal with a jitter. However, this method cannot reliably eliminate interference close to the sampling frequency.

SUMMARY

According to one exemplary embodiment, a sigma-delta converter is provided, comprising: a sampling circuit configured to sample an input signal, a sigma-delta modulator configured to process the sampled input signal and generate an output signal, and a sampling controller, configured to actuate the sampling circuit in order to sample the input signal at at least partially random sampling times.

According to a further exemplary embodiment, a method for controlling a sigma-delta converter is provided, comprising: generating at least one clock signal on the basis of a random value, and actuating a sigma-delta converter on the basis of the at least one clock signal such that sampling times of a sampling circuit of the sigma-delta converter are at least partially random.

The above summary serves merely as a brief overview of some embodiments and is not intended to be interpreted as limiting.

BRIEF DESCRIPTION OF THE DRAWINGS

FIG. 4 shows examples of signals in the exemplary embodiment of FIG. 3;

DETAILED DESCRIPTION OF ILLUSTRATIVE EMBODIMENTS

Figure 1:
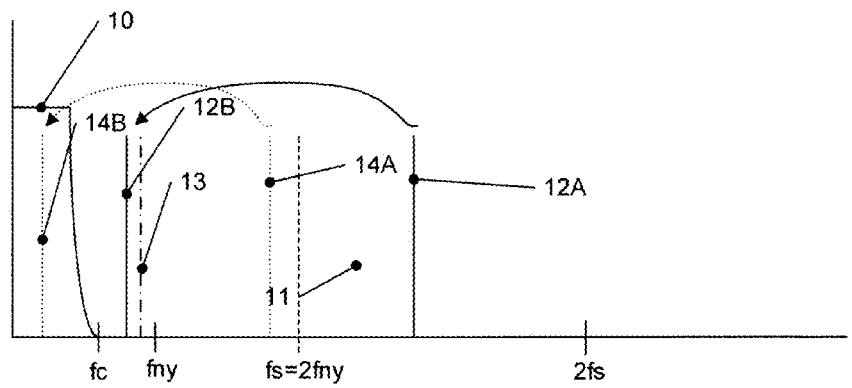
FIG. 1 is a graph to illustrate interference by aliasing in sigma-delta modulators.

Various exemplary embodiments are described below with reference to the accompanying drawings. These exemplary embodiments serve merely for illustration and are not intended to be interpreted as limiting.

By way of example, a description or depiction of an exemplary embodiment having a multiplicity of components is not intended to be interpreted to mean that all of these components are necessary for implementing exemplary embodiments. Instead, some of the components described can be omitted or replaced by alternative components in other exemplary embodiments. Also, in addition to the explicitly depicted and described components, further components can be provided, in particular components conventionally used in sigma-delta modulators and sigma-delta converters.

Variations and modifications described in one of the exemplary embodiments are also applicable to other exemplary embodiments and are thus not described repeatedly.

Any direct electrical coupling or connection shown in the figures or described below, i.e. any connection or coupling without additionally intermediate elements, can also be realized by an indirect connection or coupling, i.e. a connection or coupling with one or more additional intermediate elements, and vice versa, so long as the basic function of the connection or coupling, e.g. transmitting a particular type of signal, transmitting a particular type of information or exerting control, is fundamentally retained. Those components of exemplary embodiments that are shown in the figures can be implemented on a single chip in some embodiments, but can also be provided on two or more chips, and it is also possible for some components to be provided as discrete components on chips outside integrated circuits.

In some exemplary embodiments depicted below, an input signal is sampled. Sampling within the context of this application relates to the generating of samples based on an input signal at regular or irregular intervals. The samples can be processed in embodiments by a sigma-delta modulator in order to generate a digital output signal. In the case of a sigma-delta analog-to-digital converter, the input signal can be an analog input signal that is sampled so as then to generate a digital output signal by means of the sigma-delta modulator. Even if such sigma-delta analog-to-digital converters are described as exemplary embodiments below, other exemplary embodiments can also involve digital input signals being sampled so as then to be converted into another format, for example into a one-bit stream, by means of a sigma-delta modulator.

In some exemplary embodiments, times at which the sampling takes place, subsequently also referred to as sampling times, are at least partially random, for example random within a particular time range, the time range being stipulated and not random. Random within the context of this application includes pseudo-random approaches. Pseudo-random approaches involve random numbers or the like, for example, being generated by a deterministic circuit or an algorithm such that the result appears randomly, even if the deterministic nature of the circuit or of an algorithm that is used means that said result is in reality not random. The term "random" also includes approaches in which some elements or signals are random (including the possibility of pseudo-random generation) and further elements, such as signals, are then generated in a deterministic manner on the basis of random elements of this kind. In various embodiments, the at least partially random sampling times allow an effective sampling rate to be increased and aliasing effects to be reduced in some exemplary embodiments.

A delay within the context of this application can be an additive delay or a jitter-like delay, depending on the exemplary embodiment. An additive delay delays a current event (for example a sampling time) and subsequent events (e.g. subsequent sampling times), whereas a jitter-like delay delays only a current event (for example sampling time).

As already explained briefly at the outset, in sigma-delta modulators a non-bandlimited input signal can lead to interference in an output signal of the sigma-delta modulator. This is now explained once again more precisely with reference to FIG. 1.

In FIG. 1, an example of a signal amplitude is plotted schematically over frequency. In the example from FIG. 1, it is assumed that an input signal is sampled at a sampling frequency fs, as indicated by a dashed line 11. A frequency range of interest, subsequently also referred to as useful frequency range, in an output signal extends up to a frequency fc. fny denotes the Nyquist frequency according to fs/2. In order to satisfy the Nyquist criterion, fc must be lower than the Nyquist frequency fny, that is to say lower than fs/2. Therefore, the useful frequency range 10 is filtered out by a digital output filter, for example, in order to reject interference outside the useful frequency range 10. The ratio fs/2fc=fny/fc is also referred to as the oversampling ratio.

The signal processing by a sigma-delta modulator in this case involves components of the sampled input signal above the frequency fs up to a frequency 2fs being demodulated into a range from 0 to fs. As such, e.g. an interference amplitude 12A is demodulated to produce an interference amplitude 12B. Also, there may also be interference (undesirable signal components) between fc and fs, as indicated by a signal component 13 in FIG. 1.

The interference component 13 and the demodulated interference component 12B can also be filtered out easily by a digital output filter. Sources of interference very close to the sampling frequency fs or close to an integer multiple of the sampling frequency (2fs, 3fs, etc.), for example a source of interference 14A in FIG. 1, are more problematic, however. Said source of interference is demodulated to produce an interference component 14B below frequency fc, that is to say in the useful frequency range. This effect is referred to as aliasing.

In exemplary embodiments, sampling times are varied randomly during sampling. This random variation increases the effective sampling frequency fs crucial to the aliasing effects explained above. An effective increase of this kind for the sampling frequency by means of random variation of the sampling time thus allows aliasing effects as described above to be avoided or at least reduced in some exemplary embodiments without the need for an antialiasing filter. The latter can nevertheless be provided additionally in some exemplary embodiments however.

Figure 2:
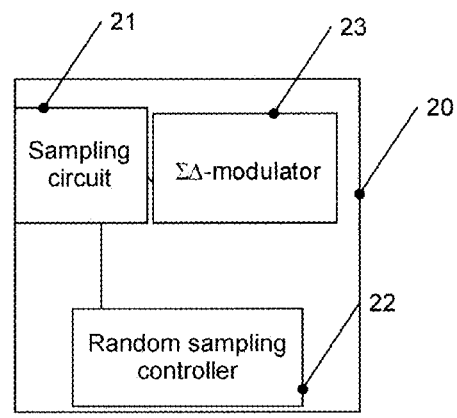
FIG. 2 is a block diagram of a sigma-delta converter according to an exemplary embodiment.

FIG. 2 shows a block diagram of a sigma-delta analog-to-digital converter according to an exemplary embodiment. FIG. 2 is used to explain techniques and principles that can be used in various exemplary embodiments. The exemplary embodiment of FIG. 2 comprises a sigma-delta analog-to-digital converter (ΣΔ-ADC) 20 having a sampling circuit 21. An input signal is received on the sampling circuit 21, sampled and then processed further by a sigma-delta modulator 23 of the ΣΔ-ADC 20.

The sigma-delta converter 20 of FIG. 2 comprises in addition a random sampling controller 22 that controls the sampling in the sampling circuit 21, wherein sampling times are varied at least partially randomly. In this case, at least partially randomly means that the sampling can basically be effected according to a sampling frequency that prescribes sampling times, and these sampling times prescribed by the sampling frequency are then varied randomly. In some embodiments, the sampling is effected such that the probability of sampling is uniform over time. In some exemplary embodiments, the sampling is effected such that an adequate settling time for components of the sigma-delta converter 20 is ensured, in particular in the sampling circuit 21. The settling time in this case relates to a time that is needed for, by way of example, voltages on the capacitances used for sampling to obtain sufficiently steady-state values. In some exemplary embodiments, multiple parallel sampling circuits are used in this case in order to achieve a uniform probability of sampling over time. In other embodiments, asynchronous converters are used in order to ensure an adequate settling time. Such exemplary embodiments are explained in more detail below with reference to FIGS. 3-14.

It should be noted that in a system with random sampling in general a single sample contains no information that is relevant in isolation. Only the combination of many samples leads to meaningful results in such cases. A sigma-delta converter affords inherent integration over multiple samples, so that in this case, in some exemplary embodiments, a signal with applicable information content (for example a digital representation of an analog input signal) can be obtained without additional circuitry from multiple samples sampled at random sampling times.

Figure 3:
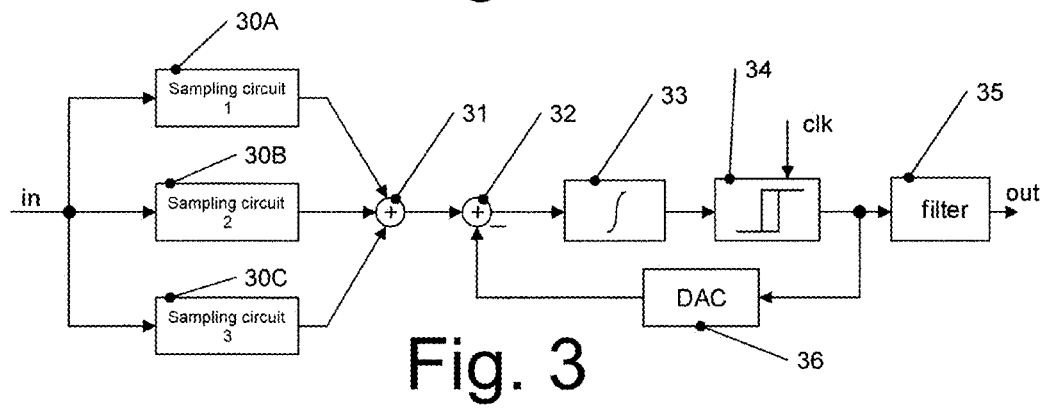
FIG. 3 is a diagram of a sigma-delta converter according to an exemplary embodiment.

FIG. 3 shows a sigma-delta converter according to an exemplary embodiment, which sigma-delta converter allows parallel sampling in order to achieve a uniform probability of sampling over time. First of all, the design of the sigma-delta converter would be explained with reference to FIG. 3, and then operation of the converter will be explained on the basis of exemplary signals, which are depicted in FIG. 4.

In the case of the apparatus in FIG. 3, an analog input signal is supplied in three sampling circuits 30A, 30B and 30C. The sampled values of the sampling circuits 30A, 30B, 30C are combined to produce a single signal, as symbolized by an adder 31. This combined signal is then supplied to a sigma-delta modulator. In particular, the signal is supplied to a positive input of a subtractor 32. An output of the subtractor is connected to an input of an integrator 33. An output of the integrator 33 is connected to a quantizer 34 that, in a case of a single-bit sigma-delta modulator, for example, can be a comparator that outputs a single-bit signal (one or zero). The quantizer 34 can alternatively be a multi-bit quantizer that outputs an n-bit signal, where n>1. The quantizer 34 is clocked by a clock signal clk that determines the bit rate of the signal that is output by the quantizer 34.

The output signal of the quantizer 34 is filtered by a digital filter 35 in order to form an output signal. The digital filter 35 can in particular be configured to remove signal components above a useful frequency range (for example above the frequency fc in FIG. 1).

Also, the output of the quantizer 34 is returned to a negative input of the subtractor 32 via a digital-to-analog converter 36 (DAC).

The components 32, 33, 34 and 36 in this case form a conventional first-order sigma-delta modulator. In other exemplary embodiments, sigma-delta modulators of a higher order and/or other conventional implementations of sigma-delta modulators can be used.

The sampling circuits 30A, 30B, 30C are in this case actuated such that there is a uniform probability of sampling of the input signal over time. While three sampling circuits 30A-30C are used in the exemplary embodiment of FIG. 3, it is also possible for more than three sampling circuits to be used in other exemplary embodiments.

It should be noted that the subtractor 32 or the adder 31 does not have to be present as a discrete element, but rather is also realizable by means of an appropriate interconnection of outputs. By way of example, the adder 31 can be realized by virtue of the outputs of the sampling circuits 30A to 30C simply being connected to one another.

This will now be explained on the basis of exemplary signals with reference to FIG. 4. The signal profiles depicted in FIG. 4 in this case serve merely for illustration, and the signal profiles can be different than the depicted signal profiles, depending on the implementations.

In FIG. 4, a signal controlling the sampling in the sampling circuit 30A is shown in the "Sampling 1" row, and Integrating 1 denotes a signal that controls the integrating of the thus sampled signal in the integrator 33. In the same way, the signals Sampling 2, Integrating 2 relate to the sampling in the sampling circuit 30B with subsequent integrating in the integrator 33, and the signals Sampling 3, Integrating 3 relate to the sampling in the sampling circuit 30C with subsequent integrating in the integrator 33. The signal in the "quantizer decision" row relating to the clocking of the quantizer 34, and the "DAC" row relates to the feedback of the quantizer decision via the digital-to-analog converter 36.

The sampling ends in each case with a falling edge of the depicted sampling signal in the Sampling 1, 2 and 3 rows. The exact time of falling edge of the respective sampling signal is varied randomly. In the example of FIG. 4, the duration of the first half of the sampling signal is fixed in each case, and has the length of one time unit, and the falling edge is then effected randomly within a further time unit, as indicated by reference sign 40. Within these time units within which the falling edge is effected randomly, a multiplicity of possible falling edges are shown in FIG. 4 in order to indicate that in this case a falling edge arises at a random time within the time unit. The time units are in this case prescribed by a clock signal, such as the clock signal clk in FIG. 3, which also clocks the quantizer.

In the time unit after the falling edge of the respective sampling circuit, the applicable integrating is then effected.

As depicted in FIG. 4, the sampling in the three sampling circuits is effected in staggered fashion in this case, wherein the rising edges are staggered by one time unit in each case, as depicted. As a result, sampling is effected in one of the three sampling circuits 30A to 30C during each time unit (with integrating in the subsequent time unit). Thus, a uniform probability of sampling over time is ultimately achieved.

Also, as depicted in FIG. 4, a quantization decision (about the integrated value of the respective preceding time unit) is made in each time unit, and this quantization decision is fed back in the respective time unit that follows the decision.

In particular, a time unit can correspond to a clock period of a clock signal clk.

In the exemplary embodiment of FIG. 4, the use of three sampling circuits can also nevertheless provide an adequate settling time.

Figure 5A:
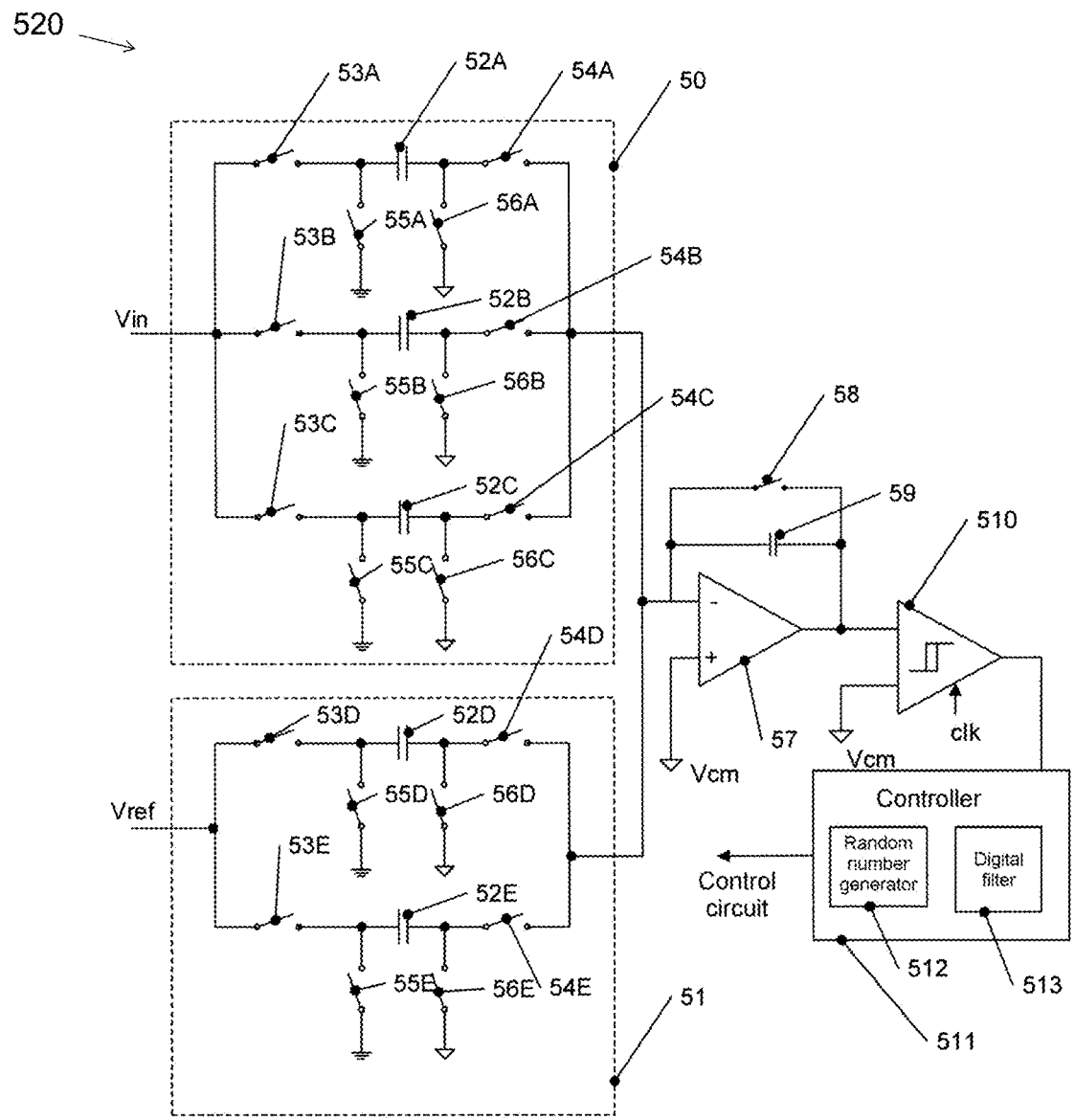
FIG. 5A is a circuit diagram of a sigma-delta converter according to an exemplary embodiment.

FIG. 5A shows a sigma-delta converter according to an exemplary embodiment, in which three sampling circuits (e.g. corresponding to the sampling circuits 30A-30C of FIG. 3) are implemented.

In the implementation example of FIG. 5A, three sampling circuits are connected in parallel and denoted 50 overall. The sampling circuits 50 receive an analog input voltage Vin.

A first sampling circuit of the three sampling circuits is described more precisely below.

The first sampling circuit comprises a sampling capacitor 52A. A first connection of the sampling capacitor 52A is connected via a first switch 53A to an input and hence, during operation, is connectable to the input voltage Vin, and a second connection of the sampling capacitor is connected via a second switch 54A to an output of the sampling circuit 50. In addition, the first connection of the sampling capacitor 52A is connected via a third switch 55A to ground, and the second connection of the sampling capacitor 52A is connected via a fourth switch 56A to a common mode voltage Vcm.

Sampling substantially first of all involves the sampling capacitor 52A being charged to the input voltage Vin by virtue of the switches 53A and 56A being closed and the switches 54A and 55A being opened. The first switch 53A and the fourth switch 56A are then opened, and the thus sampled voltage is read by virtue of the second switch 54A and the third switch 55A being closed.

The second and third sampling circuits are designed in accordance with the first sampling circuit as described, and corresponding components are denoted by the same reference signs, wherein the "A" of the first sampling circuit is replaced by a "B" for the second sampling circuit and by a "C" for the third sampling circuit.

A digital-to-analog converter is denoted generally by 520 in the exemplary embodiment of FIG. 5A. The digital-to-analog converter likewise has two sampling circuits, which are designed in accordance with the first sampling circuit of the sampling circuits 50. These two sampling circuits of the digital-to-analog converter 520 are in this case referred to as the fourth sampling circuit and the fifth sampling circuit in order to distinguish them from the sampling circuits of the sampling circuits 50. The fourth sampling circuit and the fifth sampling circuit are designed like the first sampling circuit described above, wherein the "A" is replaced by a "D" for the fourth sampling circuit and by "E" for the fifth sampling circuit.

The digital-to-analog converter 520 is supplied with a reference signal Vref instead of the input signal Vin. Said reference signal is sampled by the digital-to-analog converter 520. As explained later, this sampled reference signal is then integrated or not integrated, depending on a quantizer decision, and the overall result of this is then a digital-to-analog converter function for a fed-back output signal of a sigma-delta modulator.

The exemplary embodiment of FIG. 5A moreover has an integrator, which is formed by an operational amplifier 57 with a feedback capacitor 59. A negative input of the operational amplifier 57 is connected to the output of the sampling circuits 50 and to the output of the fourth and fifth sampling circuits of the digital-to-analog converter 520. A positive input of the operational amplifier 57 is connected to the common mode voltage Vcm. Provided in parallel with the feedback capacitor 59 is a reset switch 58 that can be used to reset the integrator, in particular to put it into a defined state.

An output of the operational amplifier 57 corresponding to an output of the thus formed integrator is connected to a first input of the quantizer 510, which is clocked by a clock signal clk. A second input of the quantizer 510 is connected to the common mode voltage Vcm. An output of the quantizer 510 is filtered by a digital filter 513 and provided as an output signal. The digital filter 513 is implemented as part of a digital controller 511 in the exemplary embodiment of FIG. 5A. The controller 511 further comprises a (pseudo) random number generator, such as a linear feedback shift register (LFSR), or an applicable algorithm for random number generation. On the basis of such random numbers, an analog delay cell is then used to produce a random delay, on the basis of which random sampling times for the sampling circuits 50 are stipulated. The controller 511 then outputs control signals for the switches 53 to 56 (in each case A to E). Non-limiting examples of such signals will now be explained with reference to FIG. 6. The signals in FIG. 6 thus again serve merely as an example and can be different, depending on the specific implementation.

Figure 6:
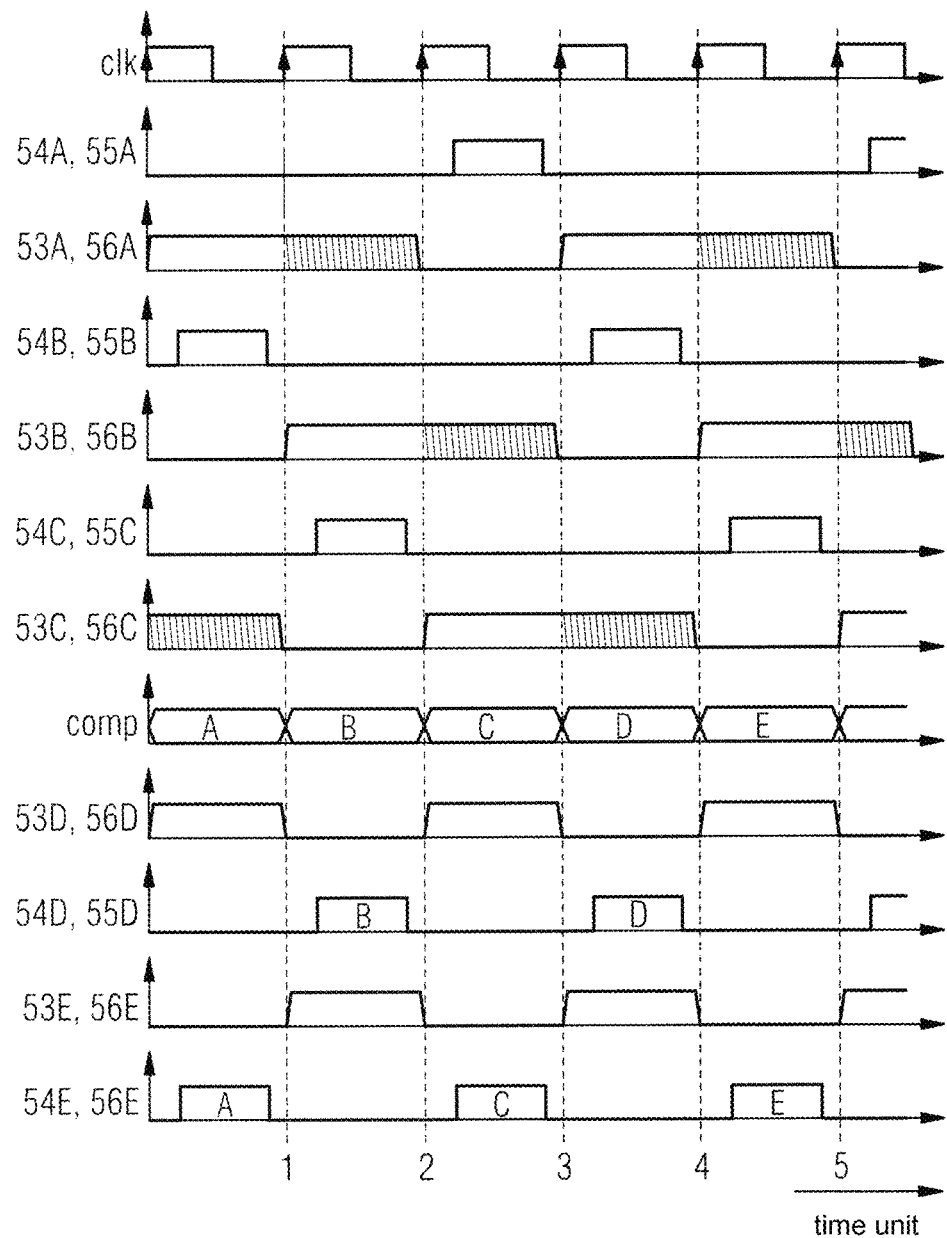
FIG. 6 shows an example of signals in the exemplary embodiment of FIG. 5A.

FIG. 6 depicts various signals from FIG. 5A over time, broken down according to time units. In the first row, a clock signal clk, as is supplied to the quantizer 510 from FIG. 5A, is depicted in this case. A time unit in FIG. 6 corresponds to one period of this clock signal.

In the next six rows, signals for controlling the switches of the sampling circuits 50 are depicted. The reference signs of those switches that are controlled by the respective signal are indicated before each row in this case.

A high level of the respective signal in FIG. 6 indicates a closed switch in this case, and a low level indicates an open switch. The signals for the switches 53, 56 (A to C) are, as already explained for the sampling with reference to FIG. 4, open again at a random time, resulting in a random sampling time within the respective time unit, wherein the sampling in the three sampling circuits is effected in a second fashion, so that sampling takes place in one of the sampling circuits 50 at a random time within each time unit. The random delays are in this case chosen such that they are between zero and a time unit corresponding to one period of the clock signal.

It should be noted that two switches are actuated using the same signal in each case in the depiction in FIG. 6 (for example switches 54A, 55A). In real implementations, the actuation can be effected in slightly time-staggered fashion, so that the switches are closed and opened in brief succession.

"comp" then denotes the applicable decision by the quantizer in the respective time unit. The last four rows denote the control signals for the switches of the digital-to-analog converter 520, wherein the letters (A to E) in the signals indicate which decision by the quantizer (likewise denoted by A to E) decides in each case whether or not the reference signal sampled by the fourth or fifth sampling circuit is integrated in the respective subsequent time unit, this corresponding to feedback of the output signal of the quantizer as also shown in FIG. 3.

The timing diagram of FIG. 6 is intended to be understood merely as an example in this case. By way of example, in other exemplary embodiments, the decision by the quantizer can also come later than shown in FIG. 6, e.g. half of one clock period later. In this case, a delay of the loop (feedback loop via the digital-to-analog converter 520) of the sigma-delta modulator can be adapted as appropriate in some exemplary embodiments. In other exemplary embodiments, the feedback can also be effected every second clock cycle, in which case only one sampling circuit is needed in the digital-to-analog converter 520 with a correspondingly larger sampling capacitor. In this case, in some exemplary embodiments, a delay of the feedback path is compensated for as appropriate by means of the digital-to-analog converter 520. This can be accomplished by using various conventional techniques.

A delay of the feedback path of a sigma-delta modulator alters a transfer function of the quantization noise of a quantizer that is used, which leads to a higher level of quantization noise in many cases. For a known delay, this effect can be compensated for in a conventional manner by modifying the modulator. An example of a first-order sigma-delta modulator is depicted in FIG. 16.

Figure 16:
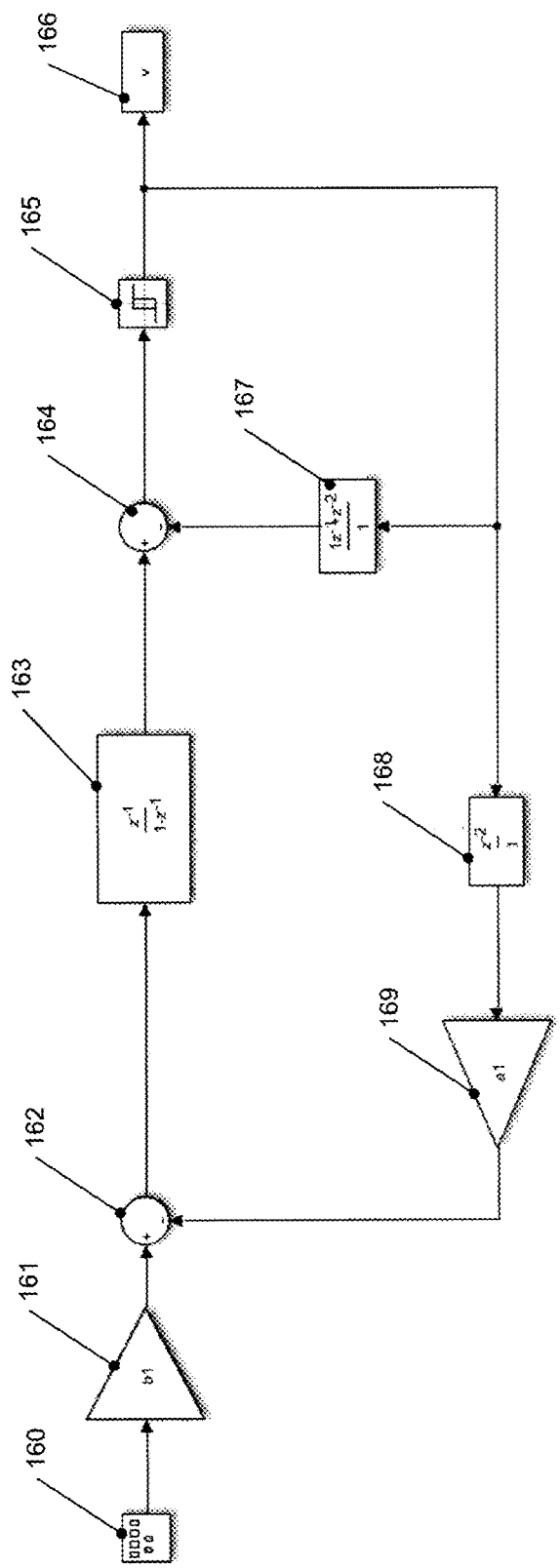
FIG. 16 shows an option for delay compensation as can be used in some exemplary embodiments.

FIG. 16 schematically shows a first-order sigma-delta modulator in which an input signal 160 (for example an analog signal sampled in a sampling circuit as described) is supplied to an amplifier 161 having a gain factor b1 and from there to a positive input of a subtractor. An output signal of the subtractor is integrated in an integrator 163. An output signal of the integrator 163 is supplied to a positive input of a subtractor 164. An output signal of the subtractor 164 is supplied to a quantizer 165, which outputs an output signal 166.

The output signal 166 is also supplied to a negative input of the subtractor 162 via a feedback path having an amplifier 169 having a gain factor a1. The feedback path in this case has an additional delay 168, which can lead to the above-described effects in consideration of the transfer function of the quantization noise.

In order to compensate for this, a negative input of the subtractor 164 is supplied with the output signal 166 via a two-bit finite impulse response filter 167 (FIR filter).

As already mentioned, the sigma-delta modulator can be not just a first-order sigma-delta modulator, as depicted in FIG. 5A, but rather it is possible for sigma-delta modulators of any orders to be used. In particular, the random sampling controller relates to the sampling of the input signal and does not influence the specific configuration of the sigma-delta modulator itself. In the case of higher-order sigma-delta modulators, it is then possible for correspondingly more complex filter functions than the filter 167 shown in FIG. 16 to be used if the feedback path has a delay in order to compensate for an influence of the delay on the transfer function of the quantization noise. This can be accomplished in particular by restoring a step response of the transfer function that is changed by the delay.

Like the digital filter 35 of FIG. 3, the digital filter 513 can also be of any desired order and can be operable continuously or incrementally.

Figure 5B:
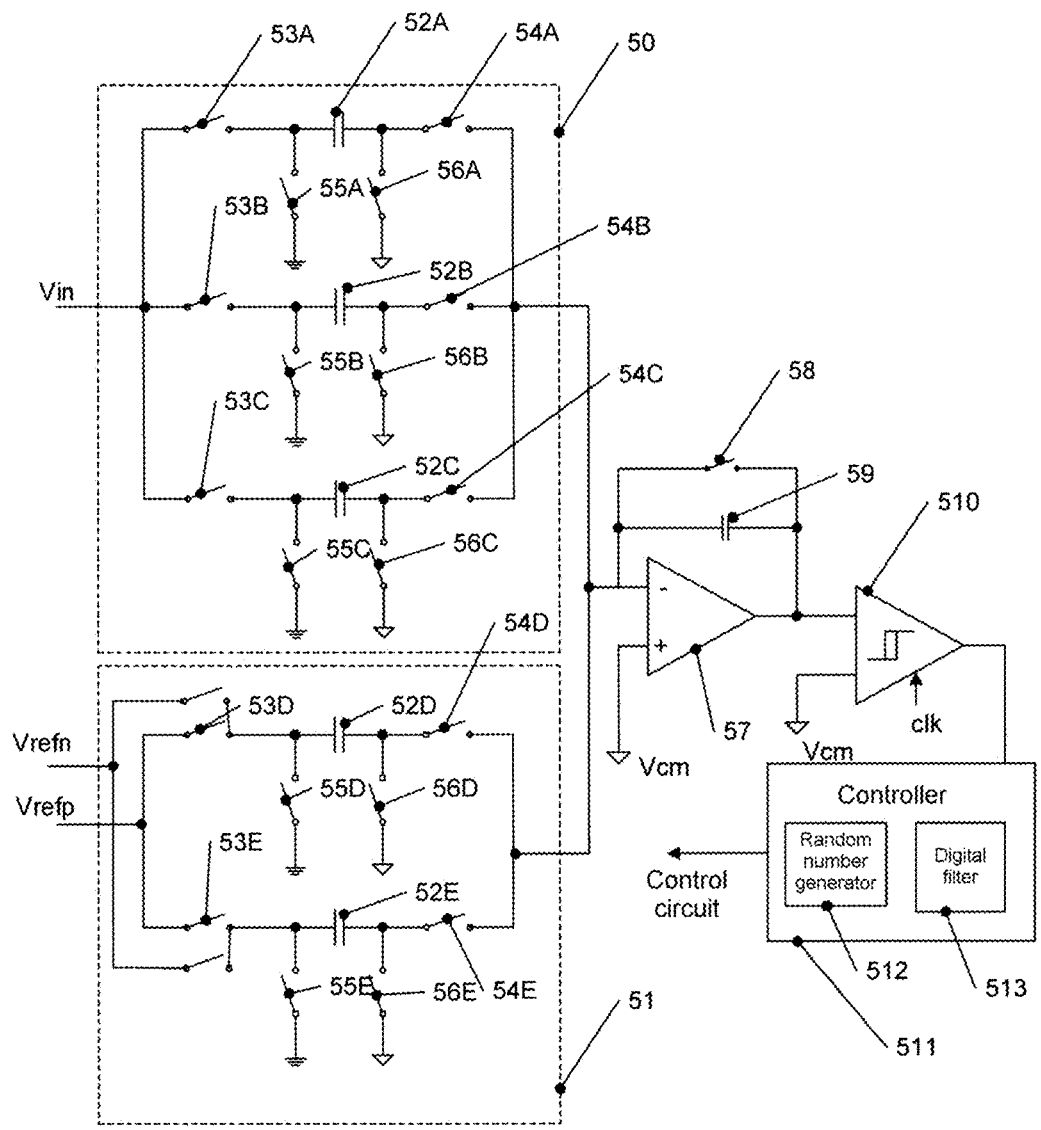
FIG. 5B shows a variant of the sigma-delta converter of FIG. 5A according to an exemplary embodiment.

As explained above, the feedback in the exemplary embodiment of FIG. 5A is effected by virtue of the reference signal being integrated or not integrated on the basis of the decision by the quantizer 510. FIG. 5B shows a variant of the exemplary embodiment of FIG. 5A, in which integration of a reference signal is always effected, but the decision by the quantizer governs which reference signal is integrated. Apart from the changes described below, the exemplary embodiment of FIG. 5B corresponds to the exemplary embodiment of FIG. 5A, and identical elements bear the same reference signs and are not explained again.

In the exemplary embodiment of FIG. 5B, the integrator 51 is optionally supplied with a first reference signal Vrefp (corresponding e.g. to a logic 1) via the switches 53D, 53E or with a second reference signal Vrefn (corresponding e.g. to a logic 0) via switches 530D, 530E. The switches 53D, 53E and 530D, 530E are controlled on the basis of an output signal of the quantizer 510, so that depending on the quantization decision either Vrefp or Vrefn is sampled and subsequently (in this case independently of the quantization decision) integrated. Therefore, a feedback path is likewise realized.

In this case, the switches 53D, 53E and 530D, 530E are closed with the same clock phase as the switches 54D, 54E, i.e. together with the latter. The switches 55D, 56D and 55E, 56E are actuated with the opposite clock phase to the switches 54D, 54E and hence also 53D, 53E and 530D, 530E.

Simulations have shown that such an approach with three parallel sampling circuits operated in staggered fashion and with random sampling times as described can reject interference as a result of aliasing.

Another option for providing a delay when sampling for sigma-delta modulators is the option of asynchronous control, in which clocking is performed on the basis of an output by a quantizer that is used. An exemplary embodiment of such an apparatus is depicted in FIG. 7.

Figure 7:
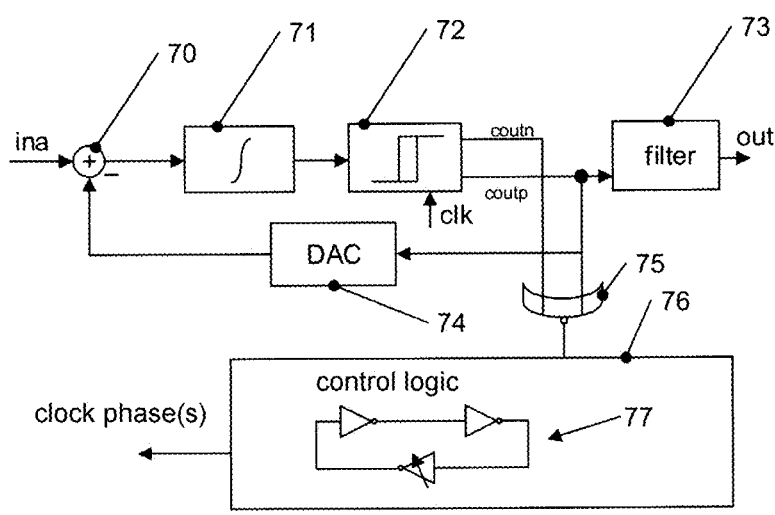
FIG. 7 is a diagram of a sigma-delta converter according to a further exemplary embodiment.

In the apparatus of FIG. 7, an input signal sampled by a sampling circuit (not depicted in FIG. 7) is supplied to a positive input of a subtractor 70. An output of the subtractor 70 is supplied to an integrator 71, followed by a quantizer 72 (for example a comparator in the case of a one-bit output signal) that is clocked by a clock signal clk. The sampling circuit and the integrator can be configured as in the figures above, for example as explained with reference to FIG. 5A.

In the exemplary embodiment of FIG. 7, the quantizer 72 outputs a signal coutp (e.g. with a value corresponding to logic 1) if the decision is positive, i.e. the signal output to the quantizer 72 by the integrator 71 is above a threshold value, for example a common mode voltage. If this is not the case, i.e. if the decision is negative, a signal coutn (e.g. with a logic 1 value) is output. Therefore, after a decision is made, a signal on the basis of which it is possible to identify when a decision by the quantizer 72 was made is output in each case. Between the decisions, e.g. during an integration phase as described, no signal is output (e.g. both coutp and coutn are at a logic 0 value). The signal coutp is output to a digital filter 73, which has the functions already explained for the digital filter 35 of FIG. 3, in order to output an output signal.

In addition, the signal coutp is fed back to a negative input of the subtractor 70 via a digital-to-analog converter 74. The digital-to-analog converter 74 can be implemented by optionally integrating a sampled reference signal, as explained with reference to FIG. 5A.

In consideration of the signal coutp, the subtractor 70, the integrator 71, the quantizer 72, the filter 73 and the digital-to-analog converter 74 correspond to the applicable components 32 to 36 of FIG. 3, and explanations at that juncture also apply to the components of FIG. 7.

The signal coutn and the signal coutp are supplied to a not-OR (NOR gate 75). The output signal of the NOR gate 75 therefore indicates when a decision by the quantizer 72 has been made, and then has a falling edge, in particular in the depicted implementation. The output signal of the NOR gate 75 is supplied to a control logic unit 76. This control logic unit comprises a delay circuit 77 in the form of a ring oscillator with an adjustable delay that controls the adjustment of a random delay, for example by means of an LSFR or another conventional circuit or an algorithm for generating random numbers. Based on the signal from the NOR gate 75 and the random delays, the control logic unit 76 then generates clock phases for controlling the sampling, the integrating by the integrator 71 and the quantizer. The output signal of the NOR gate 75 can in this case be used to guarantee that an adequate settling time is ensured and in particular sampling is complete before a next sampling and integration process is started. The control logic unit can be implemented as a logic circuit, an application-specific integrated circuit (ASIC), hardware, software on a processor or a combination of these.

Figure 8:
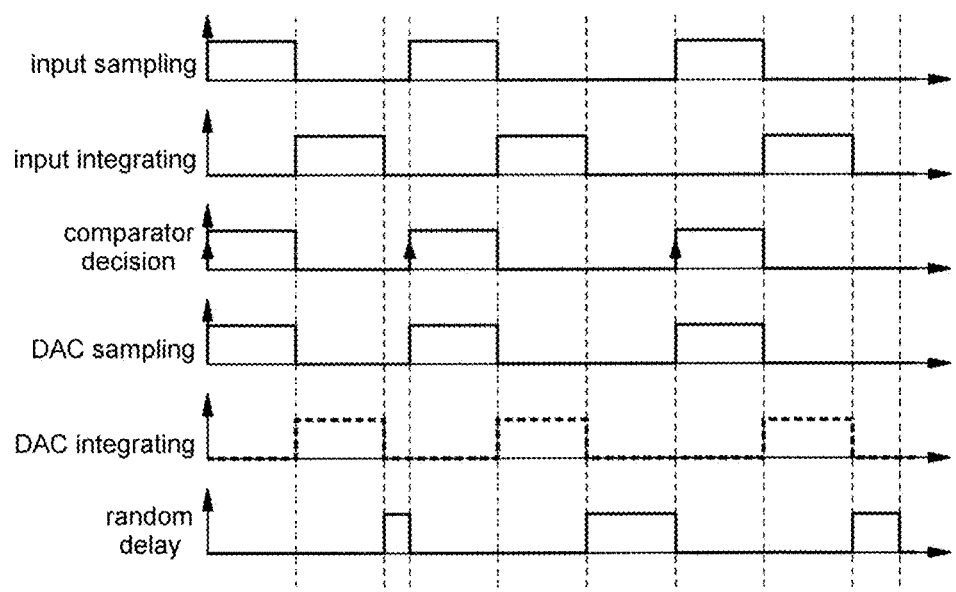
FIG. 8 shows examples of signals in the exemplary embodiment of FIG. 7.

FIG. 8 shows example signals, as are generable as clock phases by the control logic unit 76 of FIG. 7.

An "Input sampling" signal shows control of sampling of an input signal using a sampling circuit in order to generate the signal in A. An "Input integrating" signal shows the integrating of the input signal. A "quantizer decision" signal indicates when the quantizer makes a decision. A "DAC sampling" signal shows when a reference signal is sampled in the digital-to-analog converter 74, for example likewise using a sampling circuit, as has also been explained for the DAC 51 with reference to FIG. 5A. A "DAC integrating" signal indicates when this signal is integrated, wherein the integrating is in this case again optionally effected on the basis of the quantizer decision, e.g. the signal coutp, in order to implement a feedback.

Therefore, both an input signal and the feedback signal are sampled in FIG. 8. The input signal is always subsequently integrated. The reference signal is integrated only if the quantization decision indicates this, e.g. if the signal coutp indicates a positive quantization decision. After this sequence, a random delay is inserted, as indicated in the bottom-most row, before this cycle is started afresh. The random delay can in turn be produced based on a random number. The additive random delays likewise increase the effective sampling frequency, which can reduce aliasing effects in some exemplary embodiments.

Figure 9:
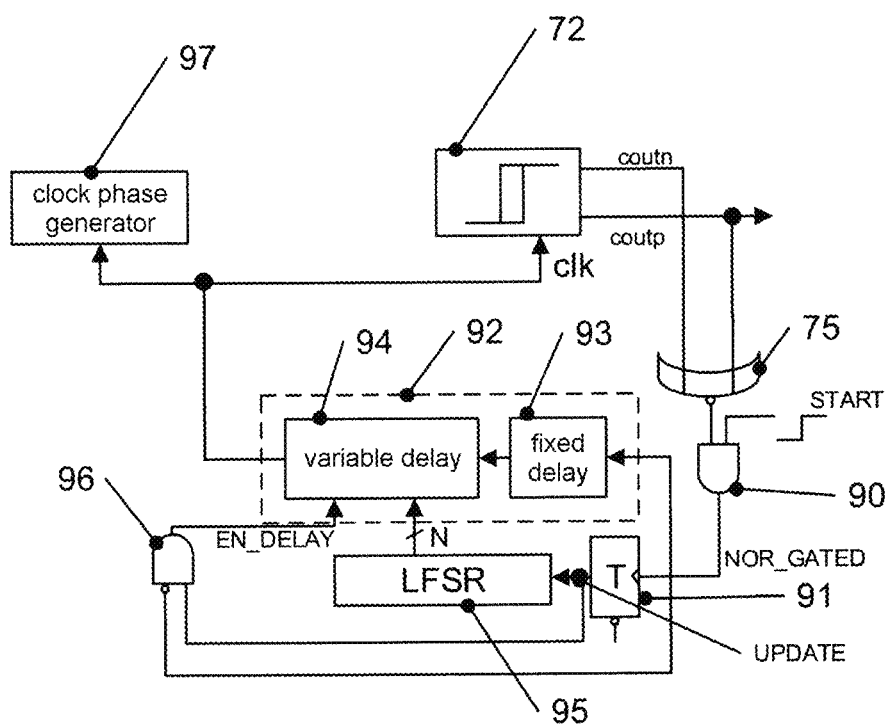
FIG. 9 is a diagram of a sigma-delta converter according to a further exemplary embodiment.

FIG. 9 shows an implementation example for the apparatus of FIG. 7, in particular for the control logic unit 76. The quantizer 72 and the NOR gate 75 correspond to the applicable components of FIG. 7. Further components such as the subtractor 70, the integrator 71, the filter 73, the digital-to-analog converter 74 and a sampling circuit are likewise provided in this case, but not depicted explicitly again in FIG. 9.

The output signal of the NOR gate 75 is in this case supplied to an AND gate 90. The AND gate 90 is also supplied with a start signal START indicating that clock phase generation is supposed to be active. The output signal of the AND gate 90 is supplied to a T-type flipflop 91 controlling an update for a linear feedback shift register (LFSR) 95. The T-type flipflop 91 in this case halves a clock frequency supplied to it. The output signal of the AND gate 90, denoted by NOR_GATED in FIG. 9, is also supplied to a fixed delay element 93, followed by an analog variable delay element 92. The fixed delay element 93 can be realized by one or more inverters, for example. The variable delay element 92 can in this case be configured as an analog delay element by means of switchable inverters, for example, or in any other conventional manner. The fixed delay element 93 and the variable delay element 94 together form a delay circuit 92 and delay the signal NOR_GATED. The thus delayed signal NOR_GATED is used as a clock signal clk for the quantizer 72. Also, further clock phases are generated therefrom using a clock phase generator 97—for example by means of multiple fixed delays—to control sampling and integrating.

The variable delay 92 is controlled by the LFSR 95, which to this end outputs an N-bit value, for example.

Also, the output signal of the T-type flipflop 91 and the signal NOR_GATED are supplied to an AND gate 96 having an inverted input as depicted, in order to generate a signal EN_DELAY that activates the variable delay.

Figure 10:
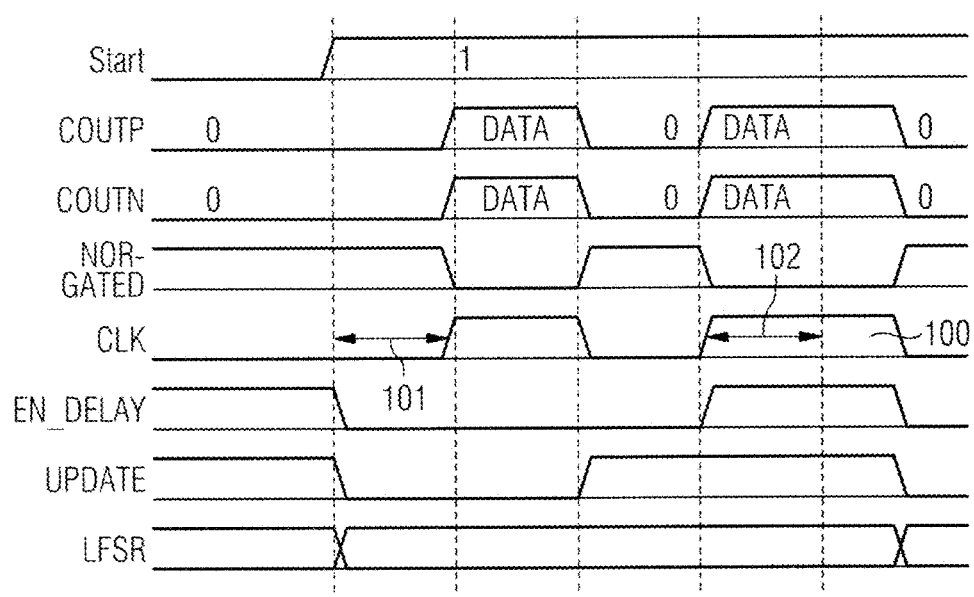
FIG. 10 shows examples of signals in the exemplary embodiment of FIG. 9.

In order to explain the manner of operation of the various components of FIG. 9 in more detail, FIG. 10 shows example signals in the exemplary embodiment of FIG. 9. In this case, 101 denotes a fixed delay produced by the fixed delay element 93, and 100 denotes a variable delay produced by the variable delay element 94. Therefore, the falling edge of the signal clk is generated in a manner delayed by a delay corresponding to the sum of the fixed delay and the variable delay to produce the signal NOR_GATED. After clock generation is started by switching the signal START to 1, a variable delay of 0, i.e. no variable delay, is added during the first crossing in this case. The signal NOR_GATED is in this case generated, as depicted, on the basis of the quantization decision. An update for the LFSR 95 is likewise effected under the control of the signal NOR_GATED via the T-type flipflop 91, in order to generate the random value N. After each falling edge of the signal UPDATE, the LFSR 95 generates a new random value N, which leads to a new variable delay.

During the performance of the comparison in the quantizer, both signals coutp, coutn are at zero, and as soon as a decision by the quantizer has been made, one of the signals changes to 1, while the other of the signals remains at zero, which produces a corresponding signal change in the signal NOR_GATED. In the exemplary embodiment of FIGS. 9 and 10, this ensures that the timing and the clock generation are continued only when a decision has been made. The length of time needed for a decision can be dependent on the input signal difference of the quantizer and can require more time in the case of a small difference.

In exemplary embodiments, both the variable delay and the fixed delay of FIG. 9 can be adjustable, for example calibratable by means of an external time reference, for example in order to compensate for temperature fluctuations or process variations.

Figure 11A:
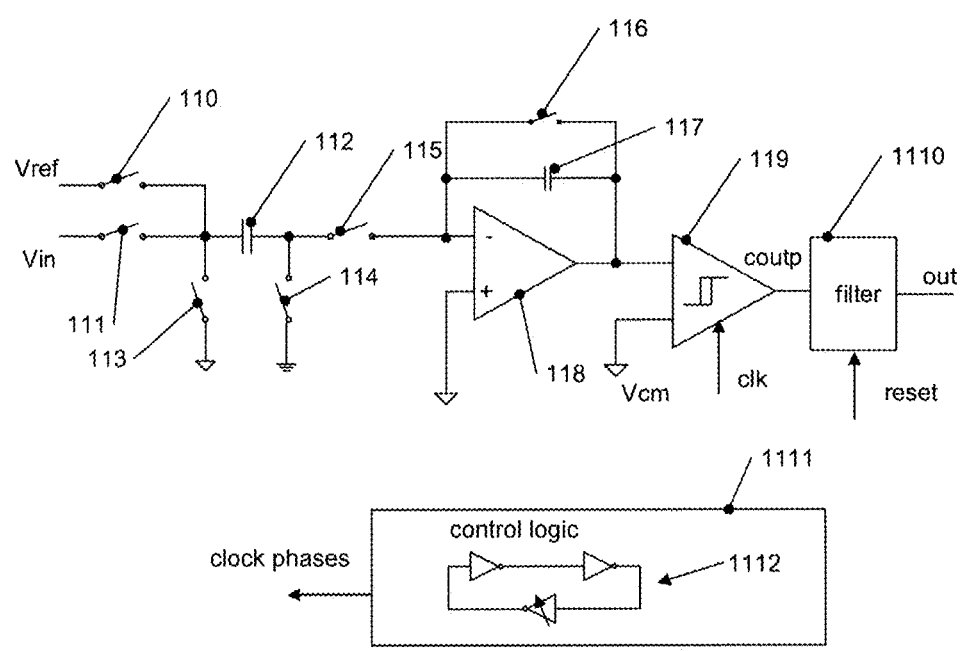
FIG. 11A is a circuit diagram of a sigma-delta converter according to a further exemplary embodiment.

A further exemplary embodiment is depicted in FIG. 11A.

FIG. 11A shows a variant of a sigma-delta converter having only one sampling capacitor 112, which is used both for sampling an input voltage $V_{in}$ to be converted and for sampling a reference voltage for the purpose of feeding back the digital output signal of a quantizer 119 of the sigma-delta converter.

A first input of the sampling capacitor 122 is couplable during operation to the input voltage $V_{in}$ via a switch 111 and to the input voltage $V_{ref}$ via a switch 110. Also, the first connection of the sampling capacitor 112 is connectable to a common mode voltage $V_{cm}$ via a switch 113.

A second connection of the sampling capacitor 112 is couplable to ground via a switch 114 and couplable to a negative input of an operational amplifier 118 via a switch 115. A positive input of the operational amplifier is connected to the common mode voltage $V_{cm}$. The sampling capacitor 112 can also be put into a defined initial state by means of a reset switch (not depicted), in particular in cases as described below in which the switches 111, 114 and the switches 113, 115 are switched together. In other exemplary embodiments, switches 111, 115 and the switches 113, 114 are switched together. In this case, the switches 113 and 114 can be closed for a defined initial state. There are thus multiple options for actuation in this case, and the option explained in more detail below is not intended to be interpreted as limiting. An output of the operational amplifier 118 and the negative input of the operational amplifier 118 have a capacitor 117 and a switch 116 connected between them in parallel. The operational amplifier 118 together with the capacitor 117 forms an integrator that is resettable via the switch 116. This is consistent with the possible design of an integrator already explained with reference to FIG. 5A.

The output of the operational amplifier 118 and therefore of the integrator is also connected to a first input of a quantizer 119. A second input of the quantizer 119 is connected to the common mode voltage Vcm. The quantizer 119 passes the signal coutp to a filter 1110, which filters out undesirable signal components as discussed and outputs an output signal out. The signal coutp is also used to control an integration of the sampled reference signal, in order to close the loop of the sigma-delta modulator as already explained above. The feedback is thus again effected by virtue of the sampled reference voltage Vref being integrated on the basis of the quantization output coutp, for example only if the quantizer 119 outputs a 1 as coutp.

The filter 1110 can be reset by a reset signal in the exemplary embodiment of FIG. 11A. The quantizer 119 is clocked by a clock signal clk.

The exemplary embodiment of FIG. 11A moreover comprises a control logic unit 1111 having a variable-delay ring oscillator 1112 that generates clock phases for actuating the switches, similarly to the control logic unit 76 of FIG. 7. An implementation example for such a control logic unit together with applicable signals is explained later with reference to FIGS. 13 and 14.

Figure 12:
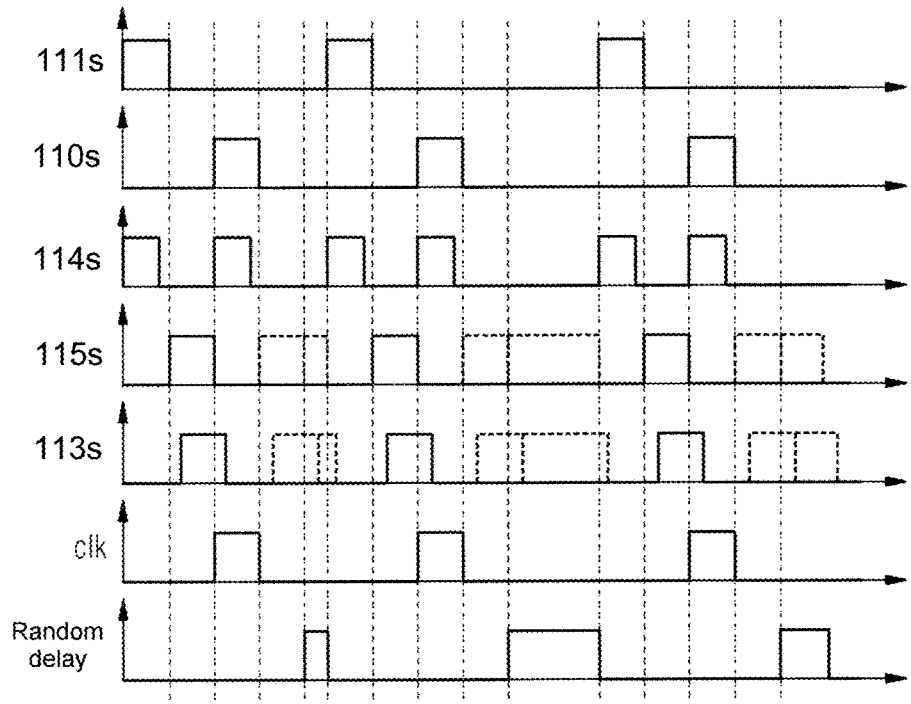
FIG. 12 shows examples of signals in the exemplary embodiment of FIG. 11A.

FIG. 12 shows an example of generated clock phases for controlling the apparatus of FIG. 11A. Control signals 111s, 110s, 114s, 115s and 113s for the switches 111, 110, 114, 115 and 113, respectively, are depicted in the first five rows of FIG. 12, a logic high level meaning a closed switch and a logic low level meaning an open switch. Furthermore, the clock signal clk, used to actuate the quantizer 119, and a random delay are also depicted.

The input voltage Vin is sampled in a clock phase in which the switches 111 and 114 are closed. Thereafter, the reference signal Vref is sampled. In parallel therewith, the signal clk is taken as a basis for making a quantization decision. Depending on the quantization decision, the reference signal is integrated or not integrated based on the signal 115s. This is depicted by dashed lines in the signal 115s. In particular, the reference is integrated if the quantization decision is positive, and is not integrated if the quantization decision is negative. This produces the feedback of the sigma-delta converter. Thereafter, the random delay is inserted before the cycle begins afresh. By contrast, the sampled input signal is always integrated (solid part of the curve for the switch 115 in FIG. 12).

The random delay results in a random sampling time, which can reduce aliasing in some exemplary embodiments. It should be noted that the random delay could also be inserted at one or more other points in the time sequence of FIG. 12, for example after the integrating of the input signal or after the sampling of the input signal and/or sampling of the reference.

Figure 11B:
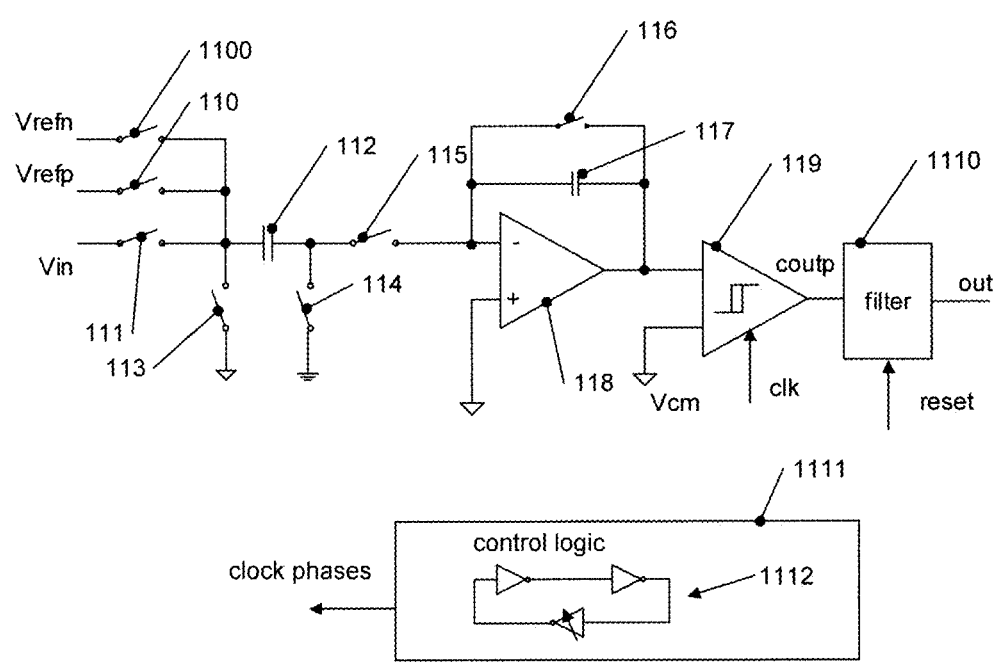
FIG. 11B shows a variant of the sigma-delta converter of FIG. 11A according to a further exemplary embodiment.

FIG. 11B shows a modification of the exemplary embodiment of FIG. 11A corresponding to the modification of the exemplary embodiment of FIG. 5B in comparison with FIG. 5A. Similarly to FIG. 5B, the exemplary embodiment of FIG. 11B also always involves a reference signal being integrated (regardless of the decision by the quantizer 119), but depending on the decision by the quantizer either a first reference signal Vrefp is integrated by closing the switch 110 or a second reference signal Vrefn is integrated by closing a switch 1100. As already explained with reference to FIG. 5B, it is also thus possible to produce a feedback. Otherwise, the exemplary embodiment of FIG. 11B corresponds to that of FIG. 11A.

Figure 13:
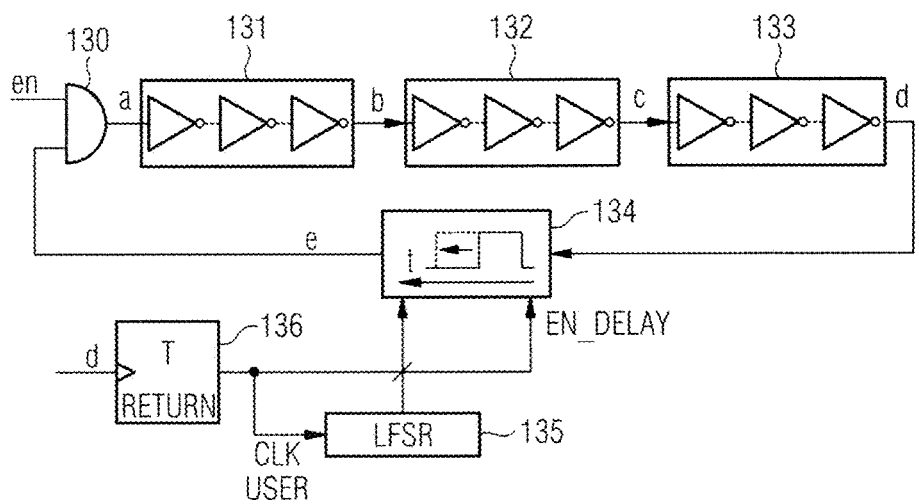
FIG. 13 shows an example of an implementation of an oscillator with variable delay that is usable in different exemplary embodiments.
Figure 14:
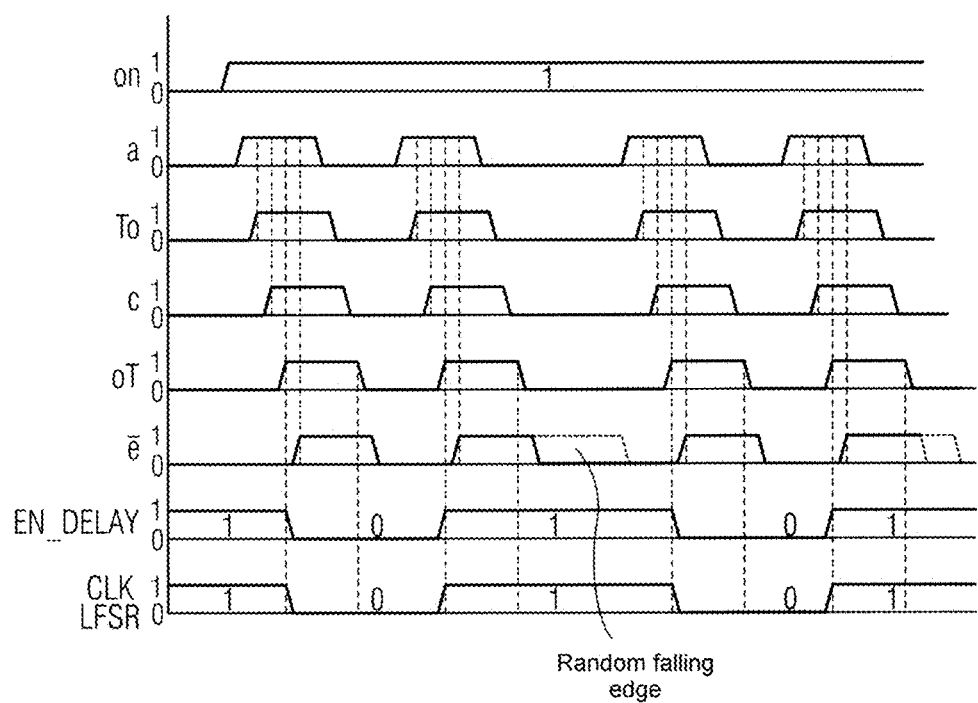
FIG. 14 shows examples of signals in FIG. 13.

FIG. 13 shows an implementation example for the control logic unit 1111, and FIG. 14 shows examples of signals in the control logic unit of FIG. 13.

The implementation example of FIG. 13 comprises a ring oscillator comprising fixed delay elements 131, 132 and 133 and a variable delay element 134. The delay elements 131-133 are in this case each formed by an uneven number of inverters in the exemplary embodiment of FIG. 13. The variable delay element 134 is implemented as an analog variable delay element delaying a falling edge of a supplied signal. An AND gate 130 can be used to activate the ring oscillator by means of an activation signal EN.

In the exemplary embodiment of FIG. 13, the variable delay element 134 is controlled by a linear feedback shift register (LFSR) 135 that outputs a pseudo-random M-bit signal so as to adjust the delay of the variable delay element 134 in pseudo-random fashion. The LFSR 135 is updated by means of a T-type flipflop 136 under the control of a signal d. An output signal of the AND gate 130 is denoted by a, an output signal of the delay element 131 is denoted by b, an output signal of the delay element 132 is denoted by c, an output signal of the delay element 133 is denoted by d and an output signal of the variable delay element 134 is denoted by e. The signal output by the T-type flipflop 136 is denoted by CLKLFSR and simultaneously activates the variable delay element 134 as the signal EN_delay.

Examples of the cited signals are depicted in FIG. 14. The signals a, c and the inverted signals b, d are delayed in succession to one another, as can be seen from FIG. 14. The output signal of the variable delay element 134, depicted in FIG. 14 in inverted form, has a random falling edge. On the basis of these signals, the random delay of FIG. 12 can then be determined, for example by virtue of the signals 113s and 115s at least partially being formed on the basis of the signal e. In this case, a similar clock phase generator to that explained with reference to FIG. 9 or another clock phase generator generating non-overlapping clock phases can be used.

The T-type flipflop 136 in this instance halves the clock frequency supplied to it, in this case the output signal of the delay element 133. Instead of the output signal of the delay element 133, it is also possible for the output signal of the delay element 131 or 132 to be used, for example.

Various exemplary embodiments have been depicted above. These exemplary embodiments are not intended to be interpreted as limiting and can be varied. By way of example, in addition to the depicted techniques, conventional techniques can be provided for sigma-delta analog-to-digital converters such as a dimmer signal at an integrator input. The sigma-delta modulators used can be of any order. Digital filters can also be of any order and be operated in a continuous or incremental manner. Even if single-pole implementations are depicted, the depicted exemplary embodiments can also be operated using differential signals. Overall, the various depicted exemplary embodiments can be operated in combination with various types of conventional sigma-delta modulators.

Figure 15:
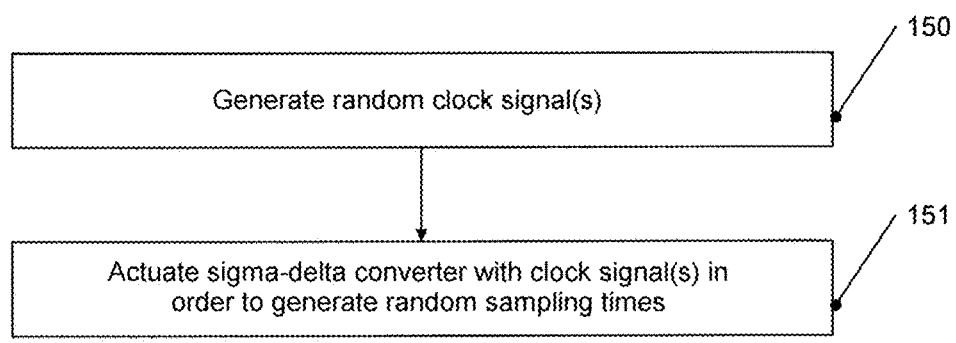
FIG. 15 is a flowchart to illustrate methods according to various exemplary embodiments.

FIG. 15 shows a flowchart to illustrate a method according to an exemplary embodiment. The method of FIG. 15 can be implemented by means of one of the apparatuses described above, and for the purposes of illustration the exemplary embodiments discussed above are referred to when describing the method of FIG. 15. The method of FIG. 15 can also be usable in other sigma-delta converter arrangements, however.

At step 150 in FIG. 15, random clock signals are generated for actuating components, in particular of a sampling circuit in the sigma-delta converter. The one or more random clock signals can be generated, as described above, for example, by means of an LFSR that is used to actuate a variable delay element in a ring oscillator as in FIG. 13 or in a linear arrangement of delay elements as shown in FIG. 9. Instead of an LFSR, other conventional options for generating pseudo random numbers are also applicable, for example relevant software algorithms.

In step 151, a sigma-delta converter, in particular a sampling circuit thereof, is actuated using the clock signals in order to generate random sampling times, with an adequate settling time being ensured. This can be realized, as discussed above, by actuating multiple parallel sampling circuits as explained with reference to FIG. 3, by means of appropriate choice of the delays and/or by means of an asynchronous converter in which the control is effected on the basis of a quantization decision that has been made. All variants and modifications discussed in this regard for the apparatuses mentioned above are also applicable to the method of FIG. 15.

Although specific exemplary embodiments have been illustrated and described in this description, persons with the usual knowledge in the art will recognize that a large number of alternative and/or equivalent implementations can be chosen as a substitution for the specific exemplary embodiments shown and described in this description without departing from the scope of the invention that is shown. It is the intention for this application to cover all adaptations or variations of the specific exemplary embodiments that are discussed here. This invention is thus intended to be restricted only by the claims and the equivalents of the claims.

What is claimed is:

1. A sigma-delta converter, comprising:
a sampling circuit configured to sample an input signal,
a sigma-delta modulator configured to process the sampled input signal and generate an output signal, and
a sampling controller, configured to actuate the sampling circuit in order to sample the input signal at at least partially random sampling times, wherein the at least partially random sampling times are based on a variable delay, and wherein a maximum length of the variable delay is a clock period of a clock signal controlling a quantizer of the sigma-delta modulator.

2. The sigma-delta converter as claimed in claim 1, wherein the sampling controller comprises a linear feedback shift register in configured to generate a random value for controlling the random sampling times.

3. The sigma-delta converter as claimed in claim 1, wherein the sampling circuit comprises a multiplicity of sampling circuits, wherein the sampling controller is configured to actuate the multiplicity of sampling circuits to sample the input signal in staggered fashion such that sampling is effected in one of the multiplicity of sampling circuits at a random time in each period of the clock signal controlling the quantizer of the sigma-delta modulator.

4. The sigma-delta converter as claimed in claim 3, further comprising at least two further sampling circuits, wherein the at least two further sampling circuits are coupled to an input for a reference signal, wherein the sampling controller is configured to actuate the at least two further sampling circuits alternately to sample the reference signal, wherein the sigma-delta modulator is configured to integrate the sampled reference signal based on a decision by the quantizer.

5. A sigma-delta converter, comprising:
a sampling circuit configured to sample an input signal,
a sigma-delta modulator configured to process the sampled input signal and generate an output signal, and
a sampling controller, configured to actuate the sampling circuit in order to sample the input signal at at least partially random sampling times, wherein the sigma-delta converter is an asynchronous apparatus in which the sampling controller is configured to actuate the sampling circuit based on a decision made by the sigma-delta modulator.

6. The sigma-delta converter as claimed in claim 5, wherein the sampling controller is configured to insert a random delay between sampling processes of the sampling circuit.

7. The sigma-delta converter as claimed in claim 5, wherein the sampling controller comprises a ring oscillator having a variable delay component, wherein the sampling controller is configured to actuate the sampling circuit based on one or more output signals of the ring oscillator.

8. The sigma-delta converter as claimed in claim 5, wherein the sampling controller comprises a delay circuit having a variable delay element in order to delay a signal showing a quantizer decision that has been made, and comprises a clock phase generator configured to generate clock signals for controlling the sampling circuit based on an output signal of the delay circuit.

9. The sigma-delta converter as claimed in claim 5, wherein the sampling circuit comprises a sampling capacitor, wherein one connection of the sampling capacitor is connected via a first switch to a signal input for receiving the input signal and via a second switch to a reference signal, wherein the sampling controller is configured to actuate the first switch to sample the input signal and the second switch to sample the reference signal, wherein the sigma-delta modulator is configured to always integrate the sampled input signal and to optionally integrate the sampled reference signal based on a decision by a quantizer of the sigma-delta modulator.

10. The sigma-delta converter as claimed in claim 5, wherein the sampling circuit comprises a sampling capacitor, wherein one connection of the sampling capacitor is connected via a first switch to a signal input for receiving the input signal, via a second switch to a first reference signal and via a third switch to a second reference signal, wherein the sampling controller is configured to actuate the first switch to sample the input signal and the second switch or third switch to optionally sample the first or second reference signal, wherein the sigma-delta modulator is configured to integrate the second or third switch based on a decision by a quantizer of the sigma-delta modulator.

11. A method for controlling a sigma-delta converter, comprising:
generating at least one clock signal on based on a random value, and
actuating the sigma-delta converter on based on the at least one clock signal such that sampling times of a sampling circuit of the sigma-delta converter are at least partially random sampling times, wherein the at least partially random sampling times are based on a variable delay, and wherein a maximum length of the variable delay is a clock period of a clock signal controlling a quantizer of a sigma-delta modulator of the sigma-delta converter.

12. The method as claimed in claim 11, wherein the actuating is effected such that a prescribed settling time for the sigma-delta modulator of the sigma-delta converter is ensured.

13. The method as claimed in claim 12, wherein the actuating of the sigma-delta converter comprises actuating a multiplicity of sampling circuits in staggered fashion such that in each clock period of a signal controlling the quantizer of the sigma-delta modulator one of the multiplicity of sampling circuits samples an input signal at a random time within the clock period.

14. The method as claimed in claim 11, wherein the generating of the at least one clock signal is based on an indicator signal indicating a decision that has been made by the quantizer of a sigma-delta modulator of the sigma-delta converter.

15. The method as claimed in claim 14, comprising at least partially randomly delaying the indicator signal, and generating the at least one clock signal on based on the delayed indicator signal.

16. The method as claimed in claim 15, wherein the partially random delaying comprises delaying by a fixed delay value and delaying by a variable random delay value.

17. The method as claimed in claim 14, wherein the at least one clock signal is generated such that a random delay is inserted in each sampling period of the sigma-delta converter.

18. The method as claimed in claim 11, further comprising generating the random value using a linear feedback shift register.

19. A method for controlling a sigma-delta converter, comprising:
generating at least one clock signal on based on a random value, and
actuating the sigma-delta converter on based on the at least one clock signal such that sampling times of a sampling circuit of the sigma-delta converter are at least partially random, wherein the sigma-delta converter is an asynchronous apparatus in which the sampling controller is configured to actuate the sampling circuit based on a decision made by a sigma-delta modulator of the sigma-delta converter.

\* \* \* \* \*